US008120232B2

(12) United States Patent  
Daniel et al.

(10) Patent No.: US 8,120,232 B2  
(45) Date of Patent: Feb. 21, 2012

(54) SENSORS AND ACTUATORS USING PIEZO POLYMER LAYERS

(75) Inventors: Jurgen H. Daniel, San Francisco, CA (US); Ana C. Arias, Los Gatos, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 169 days.

(21) Appl. No.: 12/356,475

(22) Filed: Jan. 20, 2009

(65) Prior Publication Data  
US 2010/0181871 A1 Jul. 22, 2010

(51) Int. Cl.  
*H01L 41/08* (2006.01)

(52) U.S. Cl. ............... 310/330; 310/370; 310/339

(58) Field of Classification Search .......... 310/330, 310/334, 332, 339, 331, 370; 367/160; 73/104; H01L 41/08, 41/09  
See application file for complete search history.

(56) References Cited

U.S. PATENT DOCUMENTS

| 7,104,134 B2* | 9/2006 | Amano et al. ............ 73/704 |
| 7,687,977 B2* | 3/2010 | Xu ........................... 310/339 |
| 2007/0125176 A1* | 6/2007 | Liu ............................. 73/649 |
| 2007/0188053 A1* | 8/2007 | Stark .......................... 310/339 |

* cited by examiner

*Primary Examiner* — Thomas Dougherty  
*Assistant Examiner* — Karen B Addison  
(74) *Attorney, Agent, or Firm* — Marger Johnson & McCollom, P.C.

(57) ABSTRACT

A device has a substrate, a piezo polymer layer arranged adjacent the substrate, a first electrode in contact with a first side of the layer, and a second electrode arranged adjacent the first electrode, such that when the piezo layer flexes, the first and second electrodes are arranged to detect one of a change in voltage or resistance, wherein at least one of the piezo polymer layer or the electrodes are deposited by printing. A method including depositing a spacer layer onto a substrate, depositing a piezo polymer layer onto the substrate, patterning an array of first electrodes in contact with the piezo polymer layer, and patterning an array of second electrodes adjacent the array of first electrodes, wherein depositing includes one of printing and laminating and pattering includes one of printing and etching. A method including laminating a piezo polymer layer onto a substrate, such that the layer forms at least one cantilever beam, forming a first electrode on one side of the layer, arranging a second electrode adjacent the first electrode, printing a polymer layer on the cantilever beam, and printing a proof mass on the cantilever beam.

16 Claims, 8 Drawing Sheets

SENSORS AND ACTUATORS USING PIEZO POLYMER LAYERS

BACKGROUND

Currently, most microelectromechanical systems (MEMS) sensors and actuators are based on silicon substrates and manufactured using thin-film processes. These processes generally involve various deposition, masking and cleaning or etching processes to build up a three-dimensional structure. For some devices, further etching and removal of sacrificial layers allows components of the devices to move.

The applications for these devices include sensing applications, such as pressure sensors, and accelerometers, various kinds of detectors and display devices. These devices generally perform very well, but have a cost higher than desired for certain applications, especially for applications where the devices would essentially be disposable.

Disposable pressure sensors for medical applications, blast sensors for other application such as military, fire or police applications, or movement sensors for toys would generally have to be inexpensive to manufacture. However, the performance requirements for these types of devices are lower than for other applications, and the size may also be larger. This relaxes some of the design constraints that could make the manufacture less expensive if other materials were available from which to manufacture them.

DETAILED DESCRIPTION OF THE EMBODIMENTS

Figure 1:
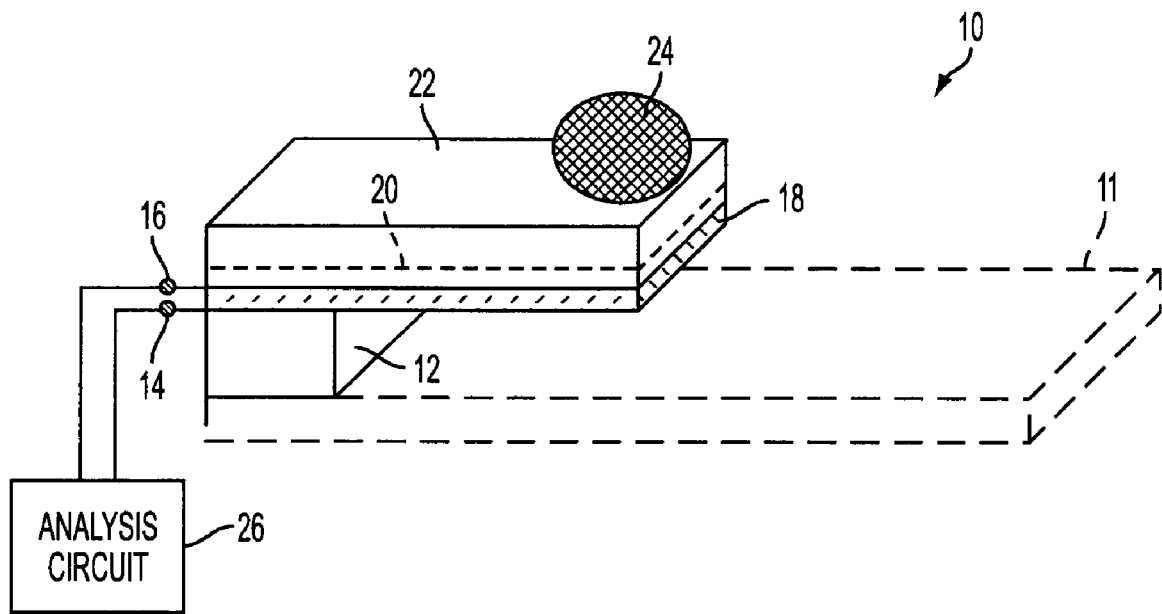
FIGS. 1 and 2 show embodiments of sensors based on piezoeffects.

Using ink jet printing to form three-dimensional structures such as those used in microelectromechanical systems (MEMS) structures does not represent a new approach. It has been shown to be possible to print a colloid ink having nanoparticles to form three-dimensional, metallic structures, rather than trying to deposit metal structures with conventional fabrication methods such as evaporation and photolithography or via electroplating. An example of this approach is discussed in, "Ink-Jet Printed Nanoparticle Microelectromechanical Systems," Fuller, et al., *Journal of Microelectromechanical Systems*, Vol. 11, No. 1, pp. 54-60, February 2002.

Another approach is to print a structure in several layers, where at least one of those layers is a sacrificial layer to later be removed. Upon removal of the sacrificial layer, a void or cavity is formed, allowing the individual MEMS structures to move or deflect in and out of the cavity. U.S. Pat. No. 7,112,463 shows an example of this approach.

Other approaches use ink-jet printing to form various structures, such as electrical interconnects; embedded electrical passive structures such as conductors, resistors, etc.; packaging; under-bump metallization; organic electronics; displays; microlenses, etc. An overview of possible techniques for using ink jet printing in MEMS manufacturing is discussed in "Ink-Jet as a MEMS Manufacturing Tool," Wallace, et al., *Microfab Proceedings*, SMTA, Hawaii, 2006.

By combining printing techniques such as screen printing, gravure printing offset printing aerosol jet printing or conventional jet printing, etc. with lamination techniques, it becomes possible to manufacture sensors and actuators based on piezoeffects such as piezoelectricity or piezoresistivity. Using a piezoelectric or piezoresistive polymer membrane or layer as a component of the device, electrodes and polymer features can be printed. For purposes of the discussion here, we will refer to the layer as the 'piezo' layer, with the understanding that it applies to either piezoelectric or piezoresistive.

Printing may be used to tune the rigidity of the mechanical structure such as a membrane or cantilever beam and it may be used to change the location of the neutral plane in a mechanical structure by depositing a precise amount of material. Inkjet printing is particularly useful in this respect because fine quantities of material can be deposited in a digital manner at precisely defined locations. Many piezosensitive sensor and actuator designs rely on 'bimorph' or 'multimorph' structures. A single beam of piezo material does not generally develop a voltage if flexed because the generated voltages due to compressive and tensile stress compensate for each other across the beam. In a bimorph structure, the neutral plane moves outside of the piezoelectric structures which generates a voltage that can be detected by electrodes. In the case of a piezoresistive sensor, the change in resistance requires strain in the piezoresistive layer which is also achieved in a bimorph structure.

Piezo polymer membranes offer some advantages for these types of structures. These membranes are generally commercially available in various thicknesses. They provide a relatively flat surface upon which jet printing can form the appropriate structures correctly. Piezo polymer membranes or polymer layers can also be deposited from a solution and therefore they may be deposited by a printing technique such as inkjet printing, for example.

In stretch-oriented piezo layers the magnitude of the piezoelectric constant is dependent on the stretch direction, and a sensor electrode generally has high sensitivity if located parallel to the orientation. One example of such a membrane is polyvinylidene fluoride membranes, or PVDF. Other membranes may also be used, if they have the characteristics of generating a voltage when flexed and available in membrane or foil form.

Figure 2:
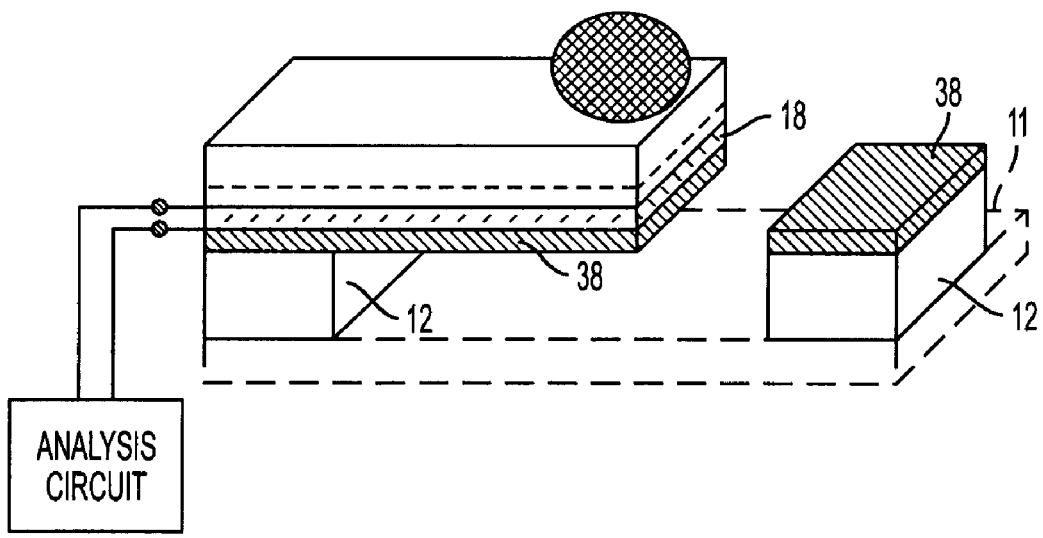

FIGS. 1 and 2 show two typical embodiments of sensors based on piezoeffects. The sensor in both figures is based on a cantilever sensor structure. Such structures are typically used for acceleration sensors, but they also can be used to measure pressure.

FIG. 1 shows an embodiment of a piezoelectric sensor consisting of a piezo polymer layer 18 shaped as a cantilever. In this embodiment, the sensor is an acceleration sensor, or accelerometer 10. The piezo polymer layer 18 is arranged adjacent the substrate 12. The substrate may consist of a pre-manufactured substrate having cavities or voids over the regions upon which the cantilever membrane will be arranged to allow the layer to move or deflect as needed. It is this movement that generates the voltage in the layer that is detectable by the sensor electrodes 14 and 16 on the opposite sides of the membrane.

A structural layer 22 is arranged adjacent the piezo layer 18. Depending upon the location of the electrodes 14 and 16, the structural layer may be printed directly onto the piezo layer, or it may be printed on either, neither or both of the electrodes. The layer 22 may define the length and width of the cantilever as well as the mechanical stiffness. This is particularly true if the Young's modulus and the thickness of the layer 22 are high compared to that of the piezo layer 18. The layer 22 may be deposited by jet printing, for example. The deposited material of layer 22 may be a polymer, a composite, a nanoparticle-based composite or a plated layer. In one example, the layer 22 is made of a jet-printed radiation curable polymer such as UV-curable polyvinylcinnamate. In another example, the layer consist of polymethylmethacrylate (PMMA), deposited from a solution. In another example, the layer 22 consists of a layer of a composite of Titanium dioxide nanoparticles in an epoxide polymer.

In a further example, the layer 22 consists of a layer of electroless or electroplated nickel. In the case of an electroplated layer, the layer may be deposited directly onto the top electrode 16 and the electrode may act as the plating base or the plating seed layer. Moreover, a plating seed layer, such as a palladium colloidal solution may be deposited by a printing method such as inkjet printing onto the cantilever. This seed layer may then cause selective electroless deposition of a material.

The structural layer 22 has the effect of moving the neutral plane 20 of the piezo layer out of the piezoelectric material, forming a bimorph structure, as mentioned above. A proof mass 24 is printed on the cantilever beam and the size of the proof mass, as well as the position on the cantilever, affects the accelerometer sensitivity. The proof mass 24 may be deposited by inkjet printing of a material such as molten lead-tin solder or by depositing particles such as nanoparticles of copper, nickel, lead or lead compounds, etc., from a solution. The proof mass may also be deposited by first printing or patterning a plating seed layer and then depositing the proof mass material by electroless- or by electro-plating. The plated proof mass material could be of any material that can be deposited by a plating or electroless plating method.

The cantilever structure shown in FIG. 1 could also form a pressure sensor and it may therefore be also used as acoustic sensor or as fingerprint sensor, for example. Such cantilever-type pressure sensors are described in U.S. Pat. No. 7,104,134 and U.S. Pat. No. 5,633,552, for example. One could imagine an array of these structures. For example the membrane or layer would be arranged as multiple cantilever beams, each beam having a corresponding proof mass. Each structure would respond differently to acceleration or pressure, allowing a more accurate detection of the acceleration or pressure force. The different response levels could result from different sizes of the proof mass 24 printed on the cantilever beams in the case of acceleration sensors, or could result from different thicknesses of the polymer layer 22 or different geometries such as length and width of the cantilever beam.

The sensor electrodes 14 and 16 would detect voltage generated by the flexing of the membrane. The differential voltage detected by these electrodes would generate a signal to an analysis circuit 26. The circuit 26 would then receive the differential signals from the electrodes and determine to what acceleration or pressure they correspond and then provide that acceleration or pressure value to other circuits or the user for recording or further analysis. A similar cantilever sensor structure as in FIG. 1 could be made by a slight variation of the process and the structural arrangement.

As illustrated in FIG. 2, the piezosensitive layer may be attached to a thin, flexible foil, thus forming a bimorph structure. The film may be a thin stainless steel foil such as a 12 micron thin or 25 micron thin stainless steel foil available from Goodfellow Corp. of Oakdale, Pa. Or the thin foil may be a Mylar or polyethylene naphthalate (PEN) thin film such as a file 1 mil thick. Here, the thin foil 38 may serve as the substrate in the process and in order to generate a suspended cantilever structure, a substrate 12 would serve as a spacer element that may be attached to the bottom of the foil. The space elements may be deposited by a printing method, such as inkjet printing, or it may be a laminated layer. In one example, the spacer is made from a jet-printed polymer, in another example, the spacer layer is made from a laminated sheet of Kapton™ foil.

The piezosensitive layer 18 may be laminated onto the thin substrate foil or it may be deposited from a solution or from a slurry. If laminated, it may be a layer of metallized PVDF foil, laminated onto the substrate foil with an adhesive such as thin silver epoxy or cyanoacrylate. The PVDF foil may be already oriented and poled and possess piezoelectric sensitivity. Internally charged cellular polymer foam electric films may be another example of a material that may be laminated on. In another method, a piezoelectric material such as PVDF-TrFE is deposited from a solution onto the thin substrate foil.

The substrate foil may have to be coated with a conductive layer first, to form a bottom electrode. For example, if the substrate foil is a PEN (polyethylene naphtalate) foil, the foil may be coated with a layer of aluminum or chrome or a conductive polymer or conductive nanoparticles may be deposited. In the case of conductive polymer such as PEDOT: PSS or nanoparticles, the bottom electrode may be deposited by a printing method such as inkjet printing. The piezoelectric material may be deposited onto the bottom electrode from a solution by inkjet printing, spray coating, dip-pen coating, spin-coating, extrusion coating, doctor blading, dip-coating, screen printing, offset printing, gravure printing or other solution deposition methods know in the art.

One example of a solution processed piezoelectric material is the copolymer PVDF-TrFE (Copolymer of vinylidene fluoride and trifluoroethylene). This copolymer can be dissolved in methyl ethyl ketone (MEK), for example. It develops piezoelectric properties after annealing at 140 degrees C. for approximately 2 hours and subsequent poling by corona charging, for example. There are other piezoelectric materials that can be deposited from solution or slurry, such as PVDF-TrFE-PZT composites, ferroelectric polymers, piezoelectric ceramic precursors, terpolymers of vinylidene fluoride, trifluoroethylene and chlorofluoroethylene, for example.

In the structure of FIG. 2, a top electrode is then patterned over the piezoelectric material, for example by printing of a conductive layer such as inkjet printing of conductive polymer (e.g. PEDOT:PSS, CLEVIOS™ from H. C. Starck). The top electrode may be also deposited by other deposition methods such as shadow mask evaporation, laser ablation, etc. A structural layer 22 may then be deposited to change the mechanical stiffness of the cantilever and a proof mass may be deposited or attached. The structures in FIGS. 1 and 2 may be attached to a bottom substrate 11.

The arrangement of the electrodes as shown in FIGS. 1 and 2 is shown as bottom and top electrode. This means that the piezo-coefficient $g_{31}$ or $g_{32}$ determines the readout charge or voltage. In $g_{31}$, '3' is the electrical readout axis which is perpendicular to the film and '1' is the mechanical in-plane axis which is being stressed. It should be noted that the sensor electrodes may also be arranged on one side of the piezoelectric film. In this case the readout voltage or charge is determined by the g11 or g22 piezo-coefficients, which usually have smaller values than the g3x coefficient. This discussion has focused on piezoelectric sensor layers.

However, the material 18 may also consist of a piezoresistive material. In this case, the material does not generate a voltage when the film is stressed, but its resistance changes. This resistance change can be measured by passing a current through the layer. In one example, a piezoresistive material is fabricated by mixing carbon nanotubes with a silicone (PDMS) at a ratio close to the percolation threshold of the carbon nanotubes. In another example, a piezoresistive layer is formed by depositing, such as jet-printing, of a conductive polymer such as PEDOT:PSS.

In the case of a piezoresistive sensor layer, the electrodes may be deposited on one side or on both sides of the sensor layer at a certain distance which determines the resistance of the sensor. Upon stressing of the layer such as bending of the cantilever structure this resistance value changes. A piezoresistive sensor layer may be patterned by lamination or by solution deposition and the structure may be similar to the one described with regard to FIGS. 1 and 2. With regard to FIG. 2 the cantilever structure requires patterning of the substrate foil. This patterning or etching may occur by laser ablation, by a stamping process or other cutting or etching process, for example. In the case of a pressure sensor based on a cantilever structure, the etched outline has to be very narrow so that it forms a resistive path for air or gas. The patterning process for the substrate foil may also pattern the sensor layer and other layers at the same time.

As discussed above, the various layers of the structure could be printed using ink jet printing, either on the substrate, followed by the lamination of the membrane and possibly more printing, or printed onto the membrane after lamination to the substrate. It is also possible to print features that would reside on the substrate and allow for construction of different types of sensors.

Figure 3:
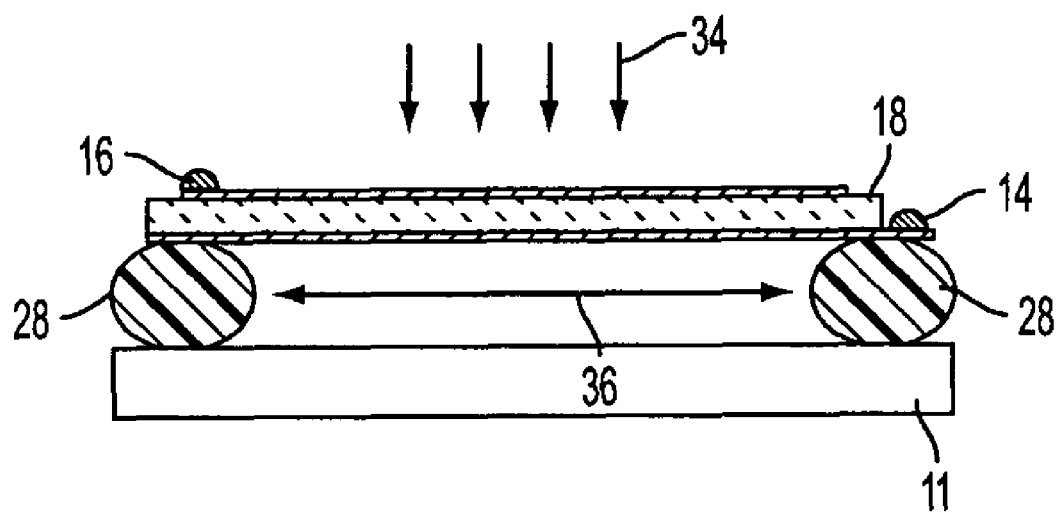
FIGS. 3 and 4 show embodiments of a pressure sensor.

FIG. 3 shows an embodiment of a pressure sensor, for example. The layer structure is very similar to the one in FIG. 1, except that the sensor membrane is stretched over a cavity and not patterned as a cantilever. The example of a pressure sensor is described, but the sensor structure may also serve as an accelerometer if the force that acts onto the membrane originates from acceleration and not from pressure. In particular, a proof mass may be attached to the membrane in order to increase the acceleration force. The sensor membrane may be attached directly to the substrate, over stamped out holes, for example. This would be similar to what was described with respect to FIG. 1.

In FIG. 3, the substrate 11 has printed upon it a spacer layer 28, consisting of spacer structures selectively printed to create cavities or voids under regions of the membrane when the membrane is applied. The spacer layer 28 may consist of a polymer such as a radiation curable polymer, and it may be applied by inkjet printing, for example. However, this layer may be also deposited by other printing methods such as screen printing, extrusion printing, laser transfer printing, offset-, gravure-, flexographic- or pad-printing or aerosol printing, for example. The layer 28 may be also deposited by printing of a plating seed layer on the substrate 11 and subsequent electro or electroless plating.

The sensor membrane 18 may then be laminated to the spacer layer employing an adhesive such as cyanoacrylate, epoxy, acrylic adhesive, urethane adhesive or conductive epoxy, for example. The spacer layer 28 may function as an adhesive for the lamination process if its surface is still slightly tacky. This may be the case if the layer 28 consists of a partially cured epoxy resin, for example.

The bottom electrode layer 14 on the sensor membrane may be deposited onto the sensor membrane before lamination, such as by physical vapor deposition of a metal conductor. The connecting electrode may be printed, laminated or otherwise applied to the spacer layer. The top electrode 16 may have been deposited onto the sensor layer before lamination such as by physical vapor deposition of a metal or it may be deposited after lamination. If the electrode layer 16 was deposited before lamination, this layer has to be patterned into the shape of an electrode. This may occur via a laser ablation process or by electrical ablation or by other etching methods. If the layer 16 is not present before lamination, it is deposited afterwards, e.g. by printing of a conductive polymer (such as PEDOT:PSS) or by evaporation of a conducting material through a shadow mask, or by other deposition methods known in the art.

The resulting pressure sensor would then generate a voltage detected by the sensor electrodes 14 and 16 when pressure is applied to the sensor in the direction of the arrows 34. The membrane would deflect into the cavity having a dimension 36, stressing the piezo layer and generating a detectable voltage for the sensor electrodes. In this electrode configuration, the g3x piezo-coefficient would determine the measured voltage.

Figure 4:
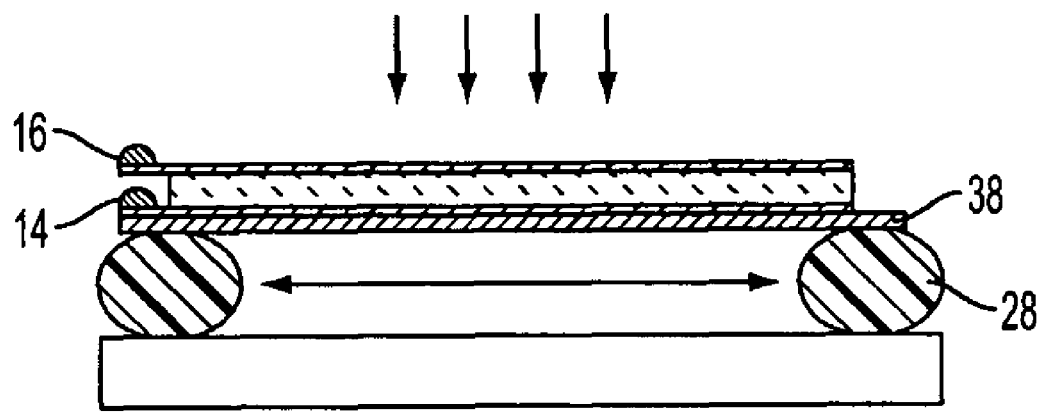

FIG. 4 illustrates a structure of the pressure sensor which is similar to the structure described with respect to FIG. 2. Here, the sensor membrane is not directly suspended over a cavity, but a thin foil substrate 38 is first attached onto the spacer layer and subsequently the piezosensitive layer is deposited by lamination or solution deposition. Similar to what was described with regard to FIG. 2, this structure allows a solution deposition process for the sensor membrane. The materials and processes are similar to the ones described with regard to FIG. 2. Also in FIGS. 3 and 4, the sensor layer may be a piezoelectric or a piezoresistive layer and the electrodes may be arranges on opposite sides of the sensor layer or on the same side. FIG. 4 may also include an optional material that may be deposited onto the sensor layer. This may be a material for a proof mass if the sensor structure is used as an accelerometer. Materials and processes for depositing a proof mass have been described with regard to FIGS. 1 and 2.

The material may also be a structural material such as an epoxy or acrylic polymer to change the mechanical stiffness of the suspended membrane. The material may also be a soft material such as a silicone (PDMS). Silicones are often applied to MEMS pressure sensors in order to reduce the thermal sensitivity of the sensor. A soft silicone layer does not substantially change the mechanical stiffness of the sensor membrane, but it adds a thermal capacitance which delays the thermal response of the pressure sensor. Such a silicone layer may be deposited by a printing method such as inkjet printing. One advantage of inkjet printing is the low force exerted onto the substrate during deposition of materials. This is important when depositing materials onto fragile structures such as membranes or cantilevers.

Figure 5:
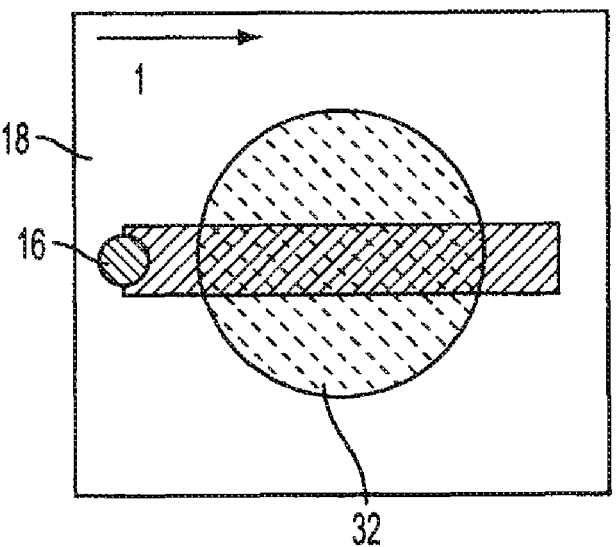
FIGS. 5 and 6 show alternative embodiments of electrodes for a piezoelectric sensor.
Figure 6:
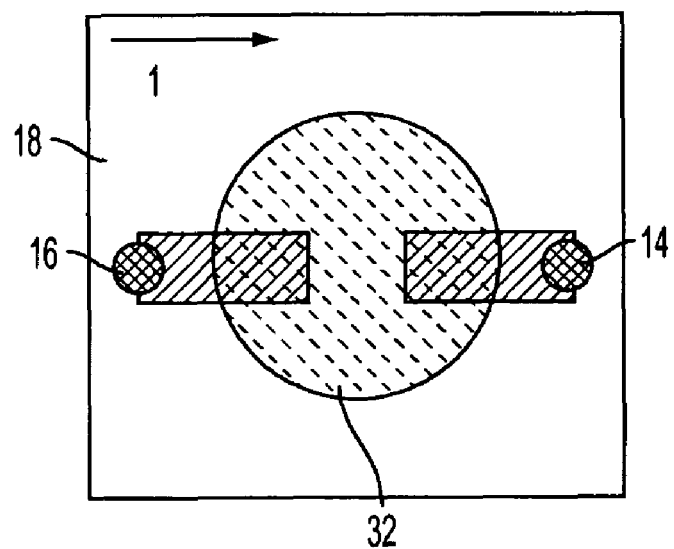

As mentioned previously, the architectures of the electrodes could take many different forms. FIGS. 5 and 6 show top views of alternative embodiments of the electrodes. In FIG. 5, the top view shown has the same electrode architecture as FIG. 3. In the top view, one cannot see the lower electrode 14, only the top electrode 16. The membrane 18 would typically be all one color, but the darker region designates the void or cavity 32. This region would have a diameter shown as dimension 36 in FIG. 2. Typically, this dimension could be in the range of 100 micrometers up to 10 mm if printing techniques are used. However larger dimensions are possible.

The diameter of the cavity in a pressure sensor determines the sensitivity and for different sensitivity ranges, sensors with different dimensions may be patterned. This electrode architecture could be formed by applying the lower electrodes to the spacer structures, or by placing the electrodes on the bottom surface of the membrane prior to laminating the membrane to the spacers. In the latter example, the electrodes could be jet printed onto the membrane. The top electrode 16 shown in FIG. 5 is patterned into a geometry that determines the measured sensor voltage. A larger electrode area gives a larger voltage at a certain amount of stress on a piezoelectric material. By tailoring the electrode area, the voltage can be adjusted to the requirements by the sensor electronics.

A sensor, as the one in FIG. 3, may have several top electrodes with different areas patterned next to each other on the surface. The different top electrodes may be used to pick up different ranges of pressure. For example, if the readout electronics is limited in voltage bandwidth, a smaller electrode area may be used to acquire the sensor signal at high pressures and a larger electrode area may be used to acquire the sensor signal for low pressures. Multiple electrodes arranged on top of the sensor membrane are also illustrated in FIG. 6.

FIG. 6 shows an alternative electrode architecture. In this embodiment, the electrodes 14 and 16 are arranged adjacent each other, either on the same or different sides of the membrane, but do not extend fully across the void region 32. While the architecture of FIG. 3 shows electrodes being on opposite sides of the membrane, it is also possible that they could be on the same side of the membrane 18, either above it or below it. As described earlier, if the electrodes are arranged on one side of a piezo layer, the sensor signal will depend on the g11 or g22 piezoelectric coefficient. The electrode arrangement shown in FIG. 6 would be typical for a piezoresistive sensor membrane where the stress in the sensor membrane changes the resistance of the area between the two electrodes 14 and 16.

In another example, there may be a common electrode on the bottom of the piezo polymer film with two or more electrodes patterned on the top. The electrodes may have different areas. This would result in the electrodes detecting different voltages or resistances because of their different areas.

Figure 7:
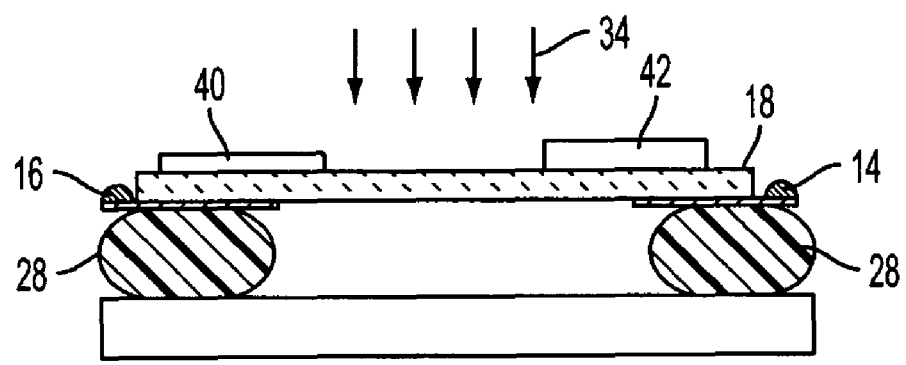
FIG. 7 shows a side view of an alternative embodiment of a pressure sensor.

Having electrodes with different architectures allows for more possibilities. For example, different thicknesses of a polymer or other structural material may be deposited over the electrode regions. FIG. 7 shows an example of this. The electrodes 14 and 16 could be located on the membrane under the structural layers 40 and 42, or they could be located under the membrane, on the spacer 28, with the polymer layers located in corresponding regions on the membrane, adjacent the electrodes.

As can be seen in FIG. 7, the structural layer 40 has a different thickness than the structural layer 42. This would be accomplished by printing the structural layer at different thicknesses. When the pressure is applied in the direction of the arrows 34, the two regions of the membrane corresponding to the electrode regions will deflect differently, allowing the electrodes to essentially have different sensitivities. The electrode sensitivity may also be affected by the electrodes themselves as described above. For example, the electrodes may be printed with different surface areas, different widths, lengths or thicknesses.

Figure 8:
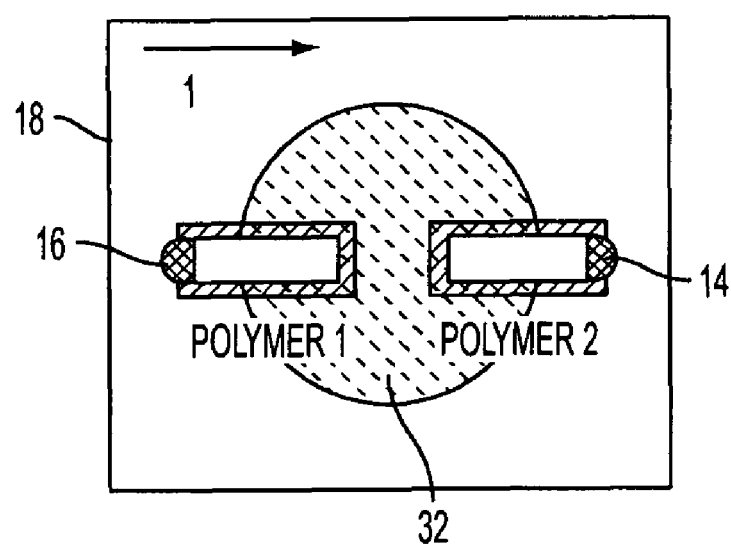
FIG. 8 shows a top view of an alternative embodiment of the electrodes for a pressure sensor.

FIG. 8 shows a top view of electrodes with structural layers such as those shown in FIG. 7. The electrodes 14 and 16 would have polymer layers printed adjacent them. Although the structural layers are shown only on top of the electrodes, they may also extend further, because the function of the structural layer is to change the mechanical stiffness of the membrane, or cantilever with regard to FIGS. 1 and 2. In an array of sensors such as acceleration or pressure sensors the structural layers may be deposited onto neighboring sensors at different thickness. That way it would be possible to fabricate an array of sensors with the same geometry and afterwards trim or adjust the sensor sensitivities or sensor sensitivity ranges by depositing a structural material such as a polymer layer. Since the deposition may occur by jet-printing which is a non-contact method, this trimming step may occur at a final fabrication stage. Again, the electrodes shown in FIG. 8 could either be on top of the membrane, underneath the membrane or one on top and the other underneath.

Figure 9:
FIGS. 9-11 show an embodiment of a manufacturing process for an embodiment of a piezoelectric sensor.
Figure 10:
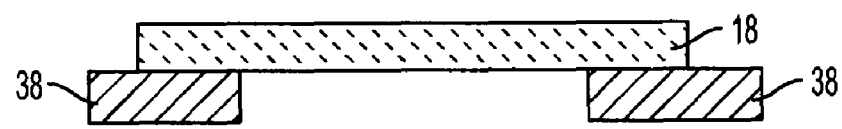
Figure 11:
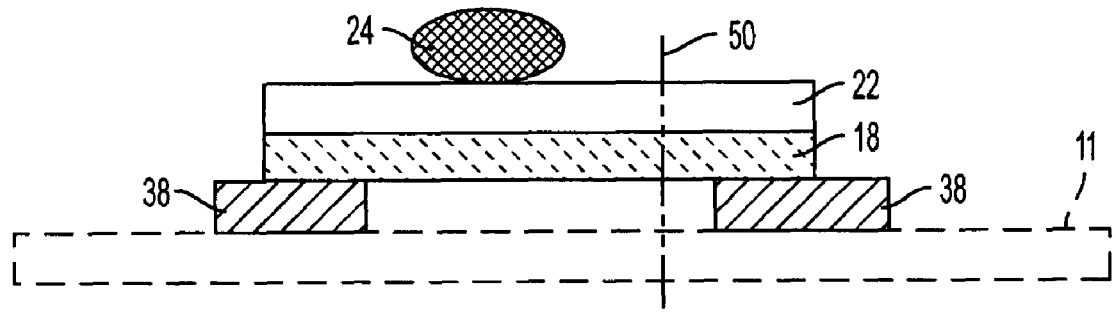

FIGS. 9-11 show an embodiment of a manufacturing process for a basic piezoelectric sensor. The described sensors and the fabrication processes may be achieved by roll-to-roll processing although the fabrication may also occur in a batch process. In FIG. 9, a foil substrate 38 such as 25 micron thick stainless steel foil is punched, laser-etched or otherwise processed so that holes or apertures form. This foil substrate may originate from a reel in a roll-to-roll process.

Piezo-sensor membranes 18 are then attached to the foil substrate as shown in FIG. 10, or a bi-layer of a thin foil membrane and a piezosensitive layer are attached to the foil substrate. The sensor foil may then be patterned into cantilever shape for cantilever type sensors and this may occur by laser-processing, for example. Electrodes, structural materials 22, other functional materials and proof mass materials 24 for accelerometers may then be deposited as shown in FIG. 11. The described process shown in FIGS. 9 and 10 fabricates the sensor structure shown in FIG. 11. Depending upon the process used, the sensor may require a laser cut such as 50 to separate it from the other sensors manufactured in the same process.

Figure 12:
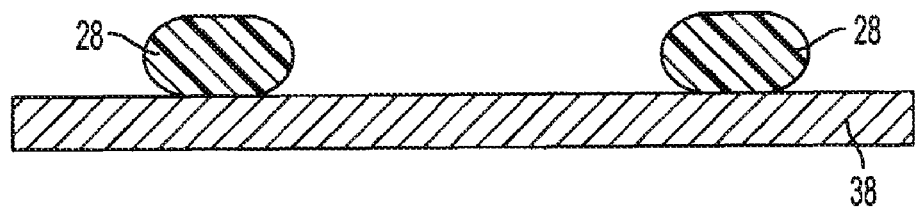
FIG. 12-14 show an embodiment of a manufacturing process for another embodiment of a piezoelectric sensor.
Figure 13:
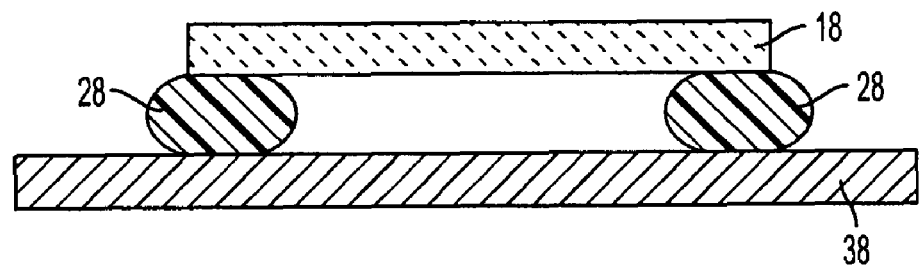
Figure 14:
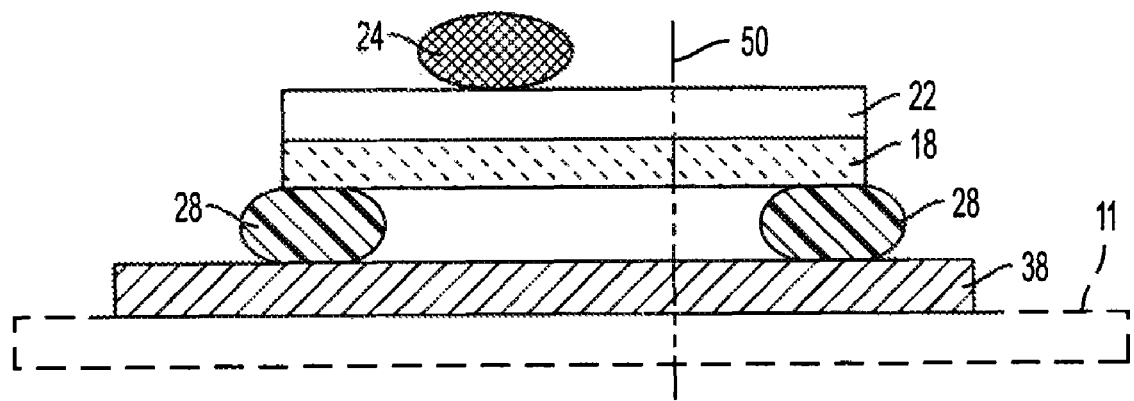

FIGS. 12-14 show an embodiment of a process for manufacturing another embodiment of a basic sensor structure. The process described with regard to FIGS. 12-14 is shown for an accelerometer structure and a pressure sensor. Here, the foil substrate, which may originate from a reel in a roll-to-roll process, does not need to be punched or otherwise etched. The cavities or suspension structures 28 are additively formed on the foil 38 by a printing or other deposition method.

Also the structure of FIG. 4 may be fabricated in this way in form of a bilayer of thin membrane and piezofilm. In FIG. 12 the fabrication process uses thin foil layers such as 38 that will become part of the sensor membrane. This thin foil layer 38 such as Mylar, PEN or stainless steel foil may originate from a reel in a roll-to-roll process. A spacer layer 28 is deposited onto the top side of the foil in FIG. 12 and the sensor layer 18 is deposited onto the top side of the spacer layer in FIG. 13. A bottom film 11 may be laminated in order to create sealed cavities for the pressure sensors as shown in FIG. 14, as well as the addition of the structural layer 22, any electrodes used, and the proof mass 24 if used. Again, the sensors may require a cut such as 50 to form cantilever shapes if desired.

Figure 15:
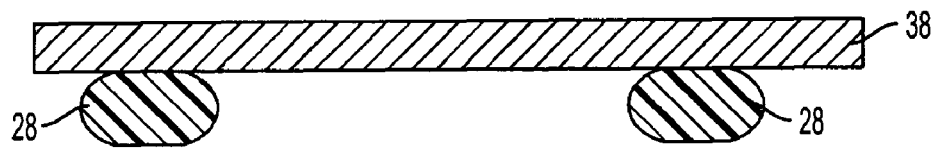
FIGS. 15-17 show an embodiment of a manufacturing process for another embodiment of a piezoelectric sensor.
Figure 16:
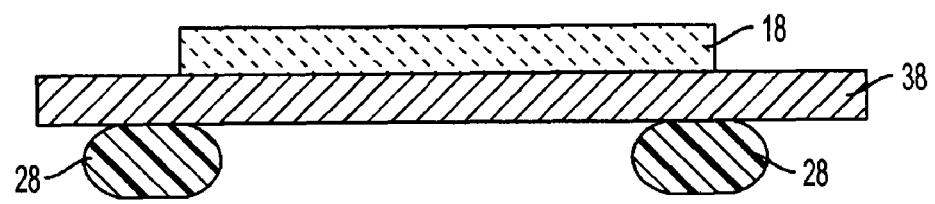
Figure 17:
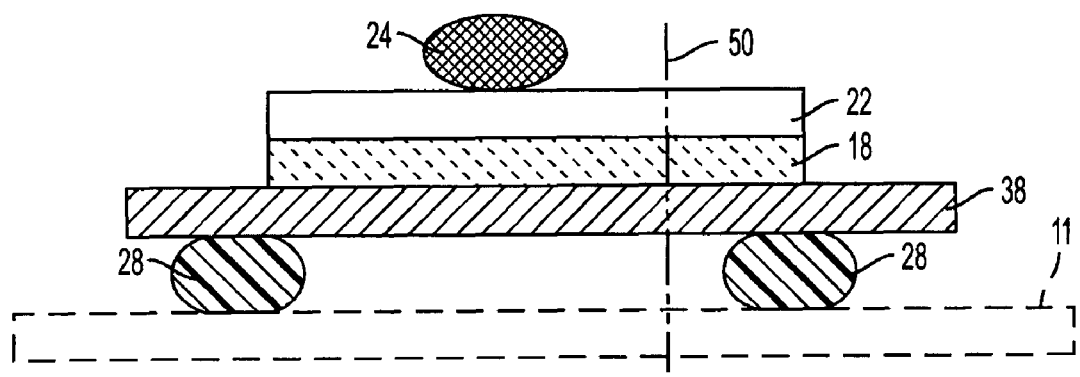

FIGS. 15-17 show another fabrication process for another embodiment of a pressure sensor. Again starting with the thin foil layer 38 in FIG. 15, the spacer layer 28 is printed on the bottom side of the thin foil layer 38. The sensor membrane 18 is laminated or deposited, including by printing, on the top side of the foil 38 in FIG. 16. The remaining structures and cutting processes are added or performed as needed in FIG. 17. This may include the structure layer 22, the proof mass 24 if used, any electrodes, and cutting along line 50, as desired. The entire structure may again be attached to a bottom substrate 11.

Figure 18:
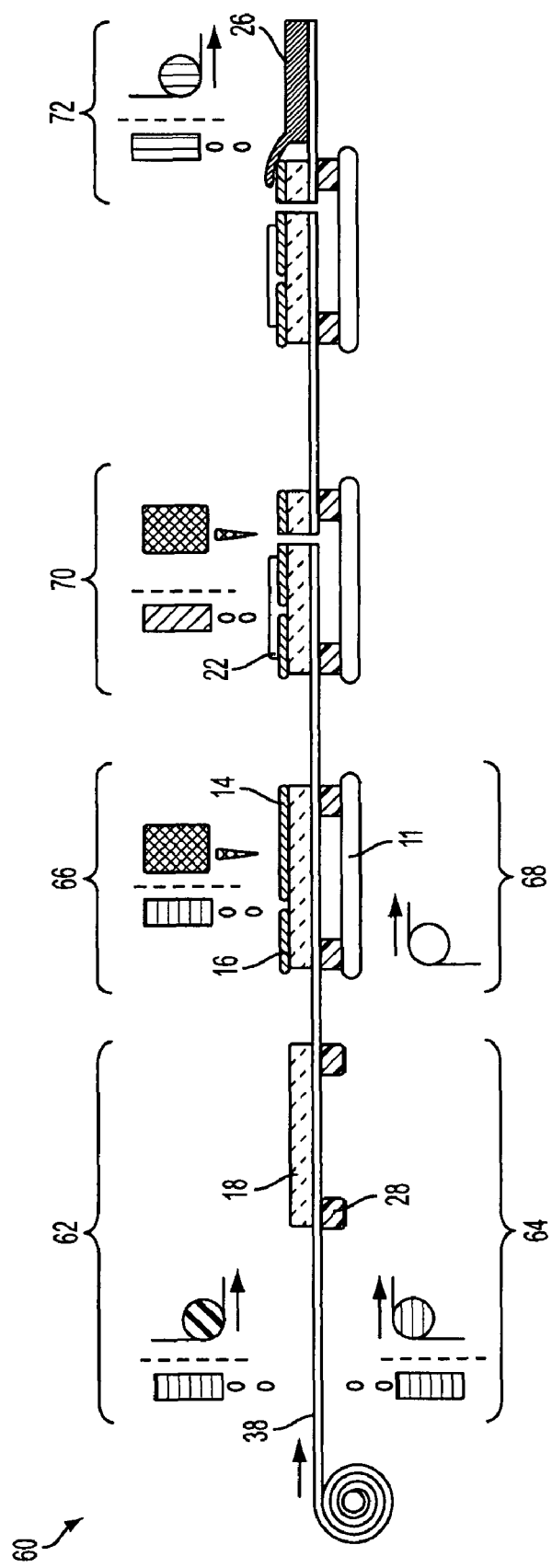
FIG. 18 shows an embodiment of a system for printing piezoelectric sensors.

FIG. 18 shows one embodiment of a system to perform such operations. The thin foil layer 38 is provided from a reel to first stages 62 and 64. Stage 62 prints or laminates the piezoelectric or piezoresistive sensor membrane 18, while stage 64 prints or laminates the spacer layer 28 on the bottom side of the foil 18. The foil then progresses past stages 66 and 68. Stage 66 prints, and if necessary, ablates the electrode patterns for electrodes 14 and 16. Meanwhile, the stage 68 attaches the underlying substrate 11 to the spacer layer 28, for example by lamination.

The foil then progresses past stage 70, which deposits the structural layer 22, possible by printing such as inkjet printing, and again, if necessary laser ablation is performed to either shape and form the structural layer 22, and to separate the sensors from each other. Stage 72 then attaches and/or prints the necessary connection lines to attach the sensors to the sensor readout electronics and analysis circuitry 26.

The resulting structure from the system shown in FIG. 18 consists of merely one possible structure. One can imagine using a substrate such as 12 from FIG. 1, with stages to stamp or etch the necessary holes to form the voids, for example. Other variations are also easily imaginable from this system, such as adding a printing stage for printing of proof masses, or varying the order or the surface upon which certain structures are printed. It would be possible to move stage 64, for example, to occur after stage 62, such that the spacer layer were printed on to the foil and the membrane 18 laminated on top of the spacer, instead of onto the membrane 18 directly.

These are just some of the possibilities of sensors and actuators manufacturable from a piezo layer and jet printed features, such as electrodes and polymer features for affecting the flexion of the membrane. By affecting the flexion of the membrane, it is possible to alter the sensitivity of the electrodes. This allows for inexpensively manufacturable MEMS sensors and actuators, making them more readily available for more applications.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A device, comprising:
a bottom substrate;
spacers attached to the bottom substrate
a piezo polymer layer arranged adjacent the substrate above the spacers;
a first electrode in contact with a first side of the layer; and
a second electrode arranged adjacent the first electrode, such that when the piezo layer flexes on the spacers, the first and second electrodes are arranged to detect one of a change in voltage or resistance, wherein at least one of the piezo polymer layer or the electrodes consists of a material suitable for deposition by printing;
wherein each electrode has a polymer feature arranged adjacent to the electrode, each polymer feature having a thickness selected to alter mechanical responsiveness of the piezo polymer layer.

2. The device of claim 1, wherein the second electrode is in contact with a second side of the layer.

3. The device of claim 1, wherein the second electrode is in contact with the first side of the layer.

4. The device of claim 1, wherein the piezo polymer layer is arranged on the substrate as at least one cantilever beam.

5. The device of claim 4, further comprising a proof mass arranged upon the cantilever beam.

6. The device of claim 5, further comprising a polymer layer between the proof mass and the cantilever beam.

7. The device of claim 4, wherein the piezo polymer layer is arranged as multiple cantilever beams, each beam having a corresponding proof mass.

8. The device of claim 7, further comprising a polymer layer between each proof mass and each cantilever beam, wherein at least two of the polymer layers have different thicknesses.

9. The device of claim 1, further comprising an electronic circuit electrically coupled to the electrodes to sense one of a change in voltage or resistance caused by any deflection in the piezo polymer layer.

10. The device of claim 1, further comprising a second substrate attached to the piezosensitive layer and a spacer layer between the second substrate and the piezoelectric layer.

11. The device of claim 10, wherein the first electrode is in contact with the first side of the layer and is in contact with the spacer layer.

12. The device of claim 10, wherein the second substrate comprises a flexible substrate.

13. The device of claim 1, wherein the first and second electrodes have different areas such that the first and second electrodes detect different changes in one of voltage or resistance.

14. The device of claim 13, wherein the first and second electrode have one of different surface areas, different lengths, or different widths.

15. The device of claim 13, further comprising three or more electrodes.

16. The device of claim 13, wherein each electrode has a polymer feature arranged adjacent to the electrode, each polymer feature having different thicknesses selected to alter mechanical responsiveness of the piezo polymer layer.

* * * * *